United States Patent
Izawa et al.

(10) Patent No.: US 6,608,725 B2
(45) Date of Patent: Aug. 19, 2003

(54) OPTICAL MODULE

(75) Inventors: Atsushi Izawa, Tokyo (JP); Masayuki Iwase, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 28 days.

(21) Appl. No.: 09/893,320

(22) Filed: Jun. 26, 2001

(65) Prior Publication Data

US 2002/0067554 A1 Jun. 6, 2002

(30) Foreign Application Priority Data

Jun. 27, 2000 (JP) ........................................ 2000-192135

(51) Int. Cl.[7] ................................................ G02B 7/02
(52) U.S. Cl. ........................... 359/811; 385/94; 257/433
(58) Field of Search ................................. 359/811, 813, 359/815, 819; 385/69, 88, 92, 94; 257/428, 432, 433

(56) References Cited

U.S. PATENT DOCUMENTS

| | | | | |
|---|---|---|---|---|
| 4,987,673 A | * | 1/1991 | Kogura et al. | ................ 29/564 |
| 5,029,968 A | * | 7/1991 | Geiser et al. | ................ 385/51 |
| 5,067,007 A | | 11/1991 | Kanji et al. | ................ 357/74 |
| 5,241,424 A | * | 8/1993 | Watanabe | ................ 359/811 |
| 5,546,489 A | | 8/1996 | Sasaki et al. | ................ 385/88 |
| 6,457,877 B2 | * | 10/2002 | Kato et al. | ................ 385/92 |
| 2001/0028770 A1 | * | 10/2001 | Hakogi et al. | ................ 385/88 |

FOREIGN PATENT DOCUMENTS

JP      1-2007618    *   8/1989    ............... 74/5.6 D

* cited by examiner

*Primary Examiner*—Huy Mai
(74) *Attorney, Agent, or Firm*—Knobbe Martens Olson & Bear LLP (57) ABSTRACT

An optical module, in which an optical device can be mounted and repaired without damaging an electrode on an electronic device side, is provided. A photodiode (1) and a pre-amplifier IC (2) are mounted on a base (stem) (4), and except for that, a relay terminal table (7) is provided. The photodiode (1) and the pre-amplifier IC (2) are connected through the relay terminal table (7) by means of bonding wires (3a, 3b). The relay terminal table (7) is connected via the bonding wire (3a) to an electrode (11) of the photodiode (1), as well as via the bonding wire (3b) to an electrode (12) of the pre-amplifier IC (2). In repairing the photodiode (1) only the bonding wire (3a) is removed for re-wiring, so that the electrode (12) of the pre-amplifier IC can be prevented from being damaged.

15 Claims, 6 Drawing Sheets

Related Art

Fig. 5

Related Art

OPTICAL MODULE

BACKGROUND OF THE INVENTION

An optical module comprising an optical device and an electronic device provided on a base is used for, for example, optical communication. An example of this kind of optical module is a pin-amplifier module on the base of which a photodiode as an optical device and a preamplifier IC as an electronic device are mounted. There is also, as an example, an optical transceiver module on the base of which a receiving IC and a transmitting IC as electronic devices and an optical device are mounted. Further, an optical bench-wired type of package exemplified by such as known CAN package, DIL (dual in-line) package and SOP (small outline package) is also a typical optical module.

SUMMARY OF THE INVENTION

The present invention provides an optical module. The optical module in an aspect of the present invention comprise:

a base;

an optical device, an electronic device and a relay terminal table mounted on the above base;

first electric wiring for electrically connecting the optical device with the relay terminal table; and second electric wiring for electrically connecting the optical device with the relay terminal table, wherein the above optical device and the above electronic device are electrically connected via the above relay terminal table by means of the above first and second electric wiring.

BRIEF DESCRIPTION OF THE DRAWINGS

Exemplify embodiments of the invention will now be described in conjunction with drawings in which.

DETAILED DESCRIPTION

Figure 4:
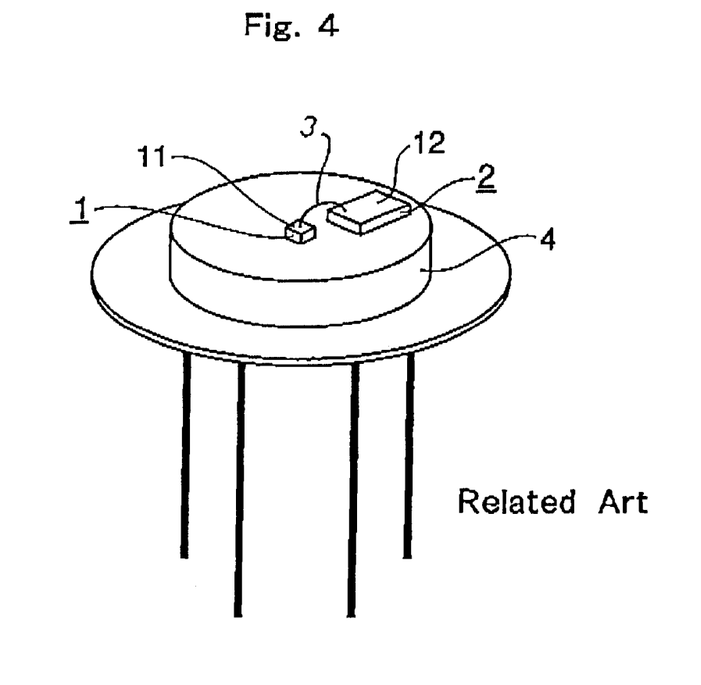
FIG. 4 is illustration showing an example of an optical module relating to the invention.

FIG. 4 shows a structure of a pin-amplifier module as an example of an optical module relating to the invention. As shown in FIG. 4, a photodiode 1 and a preamplifier IC 2 are mounted on a base (stem) 4 in the pin-amplifier module. An electrode 11 on the photodiode 1 and an electrode 12 on the preamplifier IC 2 are directly connected via a bonding wire 3, which is provided as electric wiring.

Figure 5:
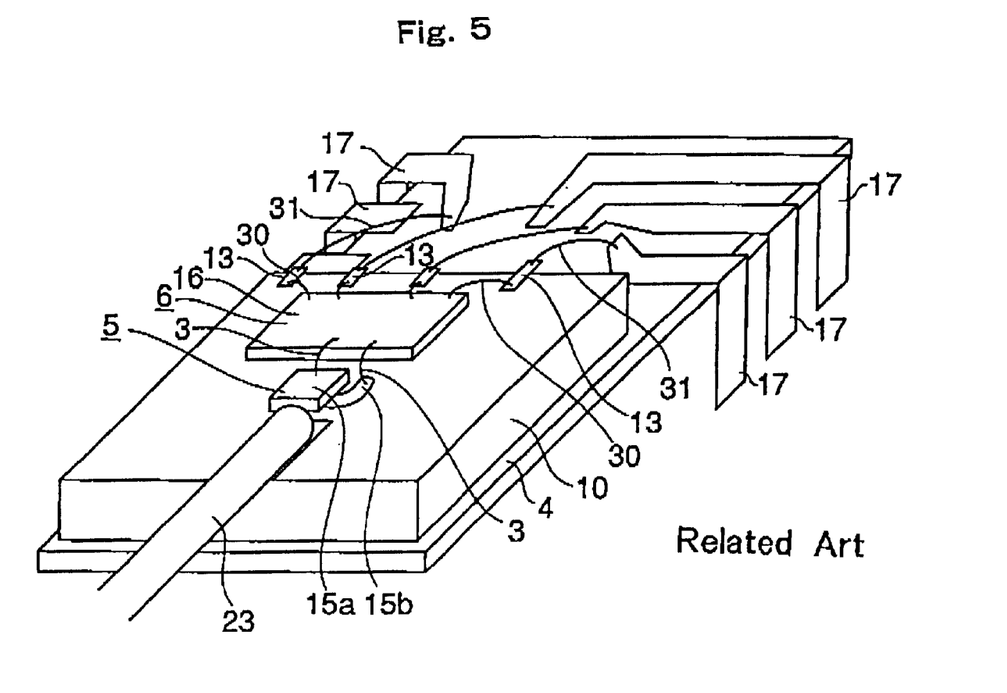
FIG. 5 is illustration showing another example of an optical module relating to the invention.

FIG. 5 shows an optical bench-wired type of optical module as another example. As shown in FIG. 5, a base 4 is provided thereon with an optical bench 10 on which an edge emition type (LD) or edge detected type (PD) of optical device 5 as an optical device and an IC 6 as an electronic device are wired. Electrodes 15a and 15b are provided on and under the optical device 5, respectively. An electrode 16 is provided on the IC 6. The electrodes 15a, 15b and 16 are directly connected by means of wiring via bonding wires 3.

The IC 6 is connected through bonding wires 30 to electrodes 13, which are connected through bonding wires 31 to lead terminals 17. In this kind of optical module, the base 4 is provided thereon with a package member (not shown), which comprises a package together with the base 4. Components on the base 4, which are shown in FIG. 5, are housed in the package, and the optical device and the electronic device inside the package are sealed all together by means of resin. This kind of optical module is generally called an optical bench-wired type of package.

Many optical devices used for the above kind of an optical bench-wired type of package are such end surface light receiving-emitting type of optical device as described above. In FIG. 5, an optical fiber 23 is disposed on the optical bench 10 so as to face to an end surface of the optical device 5.

In the above kind of optical module, however, the optical device and the electronic device are directly connected via the bonding wires 3, so that the bonding wires should be removed once before rewiring when the optical device is repaired after the direct connection. Therefore, the electronic device and its electrode would be easily damaged, which would lower possibility of success in repairing.

In the case of carrying out an electric test of an electronic device with the electronic device (IC) only mounted on the base 4 in the conventional optical module, it is required to make a probe for inspection directly touch the electrodes of the electronic device. Therefore, the electrodes of the electronic device would be easily damaged, which would increase a rate of defectives.

Further, in the optical module shown in FIG. 5, the inside of the package is sealed with resin all together. This resin-sealing is performed as a whole at the final process, so that it may be highly possible to damage the electronic device and the bonding wires 3 during a process after wiring the electronic device before the resin-sealing, that is, for example, during an optical device mounting process.

Moreover, in the optical module shown in FIG. 5, the above inside of the package is sealed with resin all together, which means that it is impossible to separate a mounting area of the optical device from that of the electronic device after the resin-sealing. Therefore, there is a problem that the optical device cannot be repaired (changed) when a defect occurs in the optical device after the resin-sealing.

The present invention provides, in its one aspect, an optical module in which it is possible to mount and repair the optical device without damaging the electrode(s) on the electronic device side.

Figure 1:
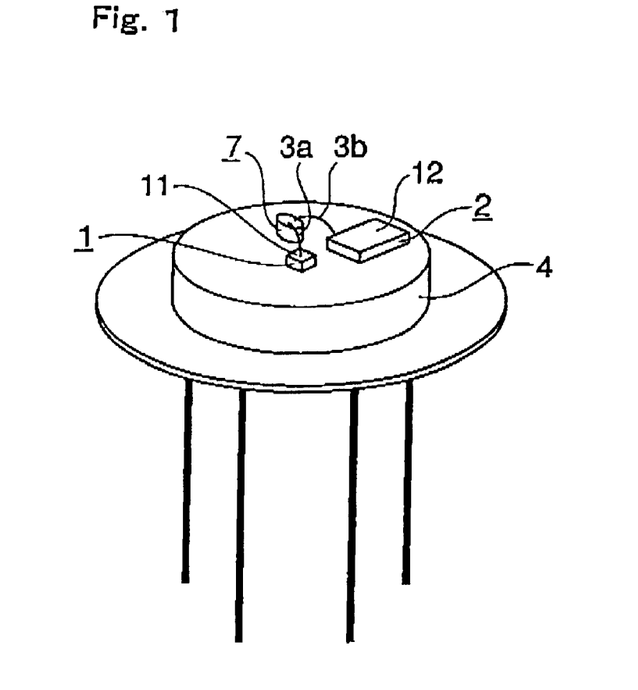
FIG. 1 is a structural illustration showing a first embodiment of the optical module according to the invention.

Each embodiment of the invention will be described below, in which portions having a same name as those of the above related art are marked with the same reference number and overlapped description would be omitted or summarized. FIG. 1 shows a structure inside the package (in which the package (not shown) above a base 4 is removed) in a first embodiment of the optical module according to the invention.

The optical module in the first embodiment is a pin-amplifier module. The difference between the pin-amplifier module in this embodiment and the conventional pin-amplifier module shown in FIG. 4 lies in that the relay terminal table 7 is provided on the base (stem) 4 other than the photodiode 1 and the preamplifier IC 2 and that the photodiode 1 and the preamplifier IC 2 are connected by means of electric wiring via the relay terminal table 7.

In the first embodiment, the relay terminal table 7 is made of ceramic such as alumina or insulative material such as glass. A metal pattern to be connected with bonding wires 3a and 3b is formed on the upper surface of the relay terminal table 7. The metal pattern is connected through the bonding wire 3a as the electric wiring on the optical device side to an electrode 11 of the photodiode 1, as well as through the bonding wire 3b as the electric wiring on the electronic device side to an electrode 12 of the preamplifier IC 2.

The first embodiment is constructed as described above. In this embodiment, the photodiode 1 and the preamplifier IC 2 are connected via the relay terminal table 7 by means of bonding wires 3a and 3b. Thus, in the case of repairing the photodiode 1 after the electric wiring, the bonding wire 3a between the photodiode 1 and the relay terminal table 7 is removed to change the photodiode, and then, the bonding wire 3a is remounted. Such repairing can prevent the electrode 12 of the preamplifier IC 2 from being damaged.

Further, in the first embodiment, in the case of carrying out an electric test of the preamplifier IC 2 with, for example, the preamplifier IC 2 only mounted on the base 4, the electric test can be achieved by making a probe for inspection touch a electrode 12 with the bonding wire 3b of the relay terminal table 7. Thus, it is not required to make the probe for inspection directly touch the electrode 12 of the preamplifier IC 2 as conventionally, which can prevent the electrode 12 of the preamplifier IC 2 from being damaged and can lower a rate of defectives of the optical module.

Figure 2:
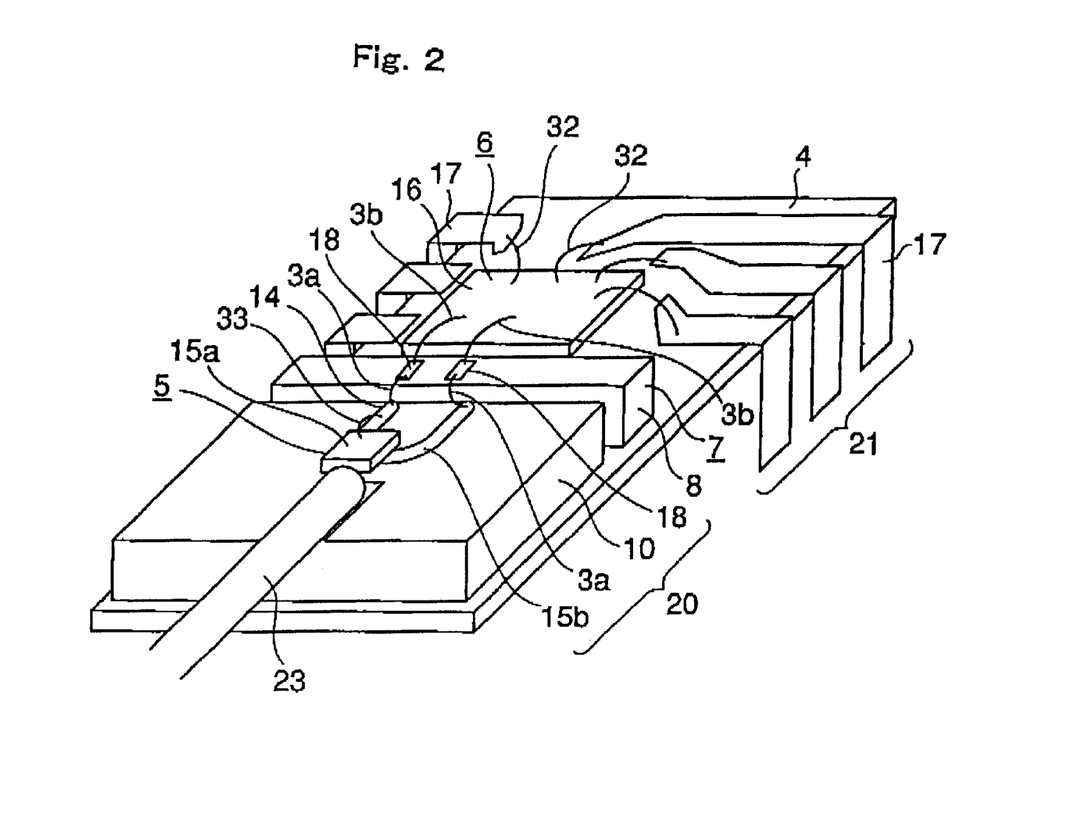
FIG. 2 is structural illustration showing a second embodiment of the optical module according to the invention.

FIG. 2 shows a second embodiment of the optical module according to the invention. The optical module in the second embodiment is an optical bench-wired type of package. The difference between the optical bench-wired type of package in the second embodiment and the conventional optical bench-wired type of package shown in FIG. 5 lies in that the relay terminal table 7 is provided on the base 4 and the optical device 5 and the IC 6 are connected by means of electric wiring via the relay terminal table 7 in the second embodiment.

In the second embodiment, an optical device mounting area 20 where the optical device 5 is mounted and an electronic device mounting area 21 where the IC 6 is mounted are separated on the base 4. The relay terminal table 7 functions as a first wall portion 8, which is stood on the base 4 at the boundary between the above optical device mounting area 20 and the above electronic device mounting area 21. An electrode 18 is formed on the upper surface of the relay terminal table 7.

The electrode 18 of the relay terminal table 7 is connected through the bonding wire 3a to the electrode 15b of the optical device 5 and an electrode 14 of the optical bench 10. The electrode 14 is connected through a bonding wire 33 to the electrode 15a of the optical device 5 The electrode 18 is further connected through the bonding wire 3b to an electrode 16 of the IC 6. In the second embodiment, the IC 6 is provided directly on the base 4 and the optical device 5 is provided on the optical bench 10. The package member disposed above the base 4 is omitted to be shown in FIG. 2, as same as FIG. 5.

In the second embodiment, the optical device 5 and the IC 6 are connected by means of electric wiring through the relay terminal table 7, so that it can be prevented that the electrode 16 of the IC 6 is damaged when the optical device 5 is repaired, as well as the first embodiment. Further, the electrode 16 can be prevented from being damaged in the case of carrying out an electric test of the IC 6, which can lower a rate of defectives of the optical module.

Moreover, the optical device mounting area 20 where the optical device 5 is mounted and the electronic device mounting area 21 where the IC 6 is mounted are separately arranged on the base 4 in the second embodiment. The relay terminal table 7 comprises the first wall portion 8, which is stood on the base 4 at the boundary between the above optical device mounting area 20 and the above electronic device mounting area 21. This divisional structure makes it easy to mount or repair the optical device 5 even after mounting the IC 6. Thus, it can be prevented much more surely to damage the IC 6 during such operations.

Figure 3A:
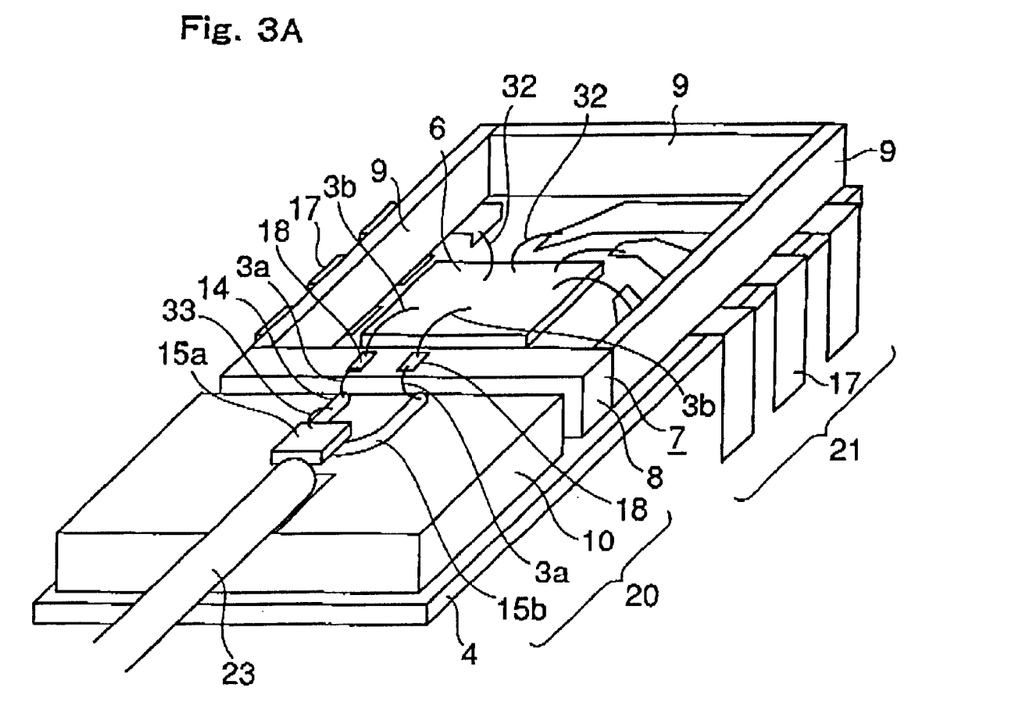
FIGS. 3A and 3B are structural illustration showing a third embodiment of the optical module according to the invention.
Figure 3B:
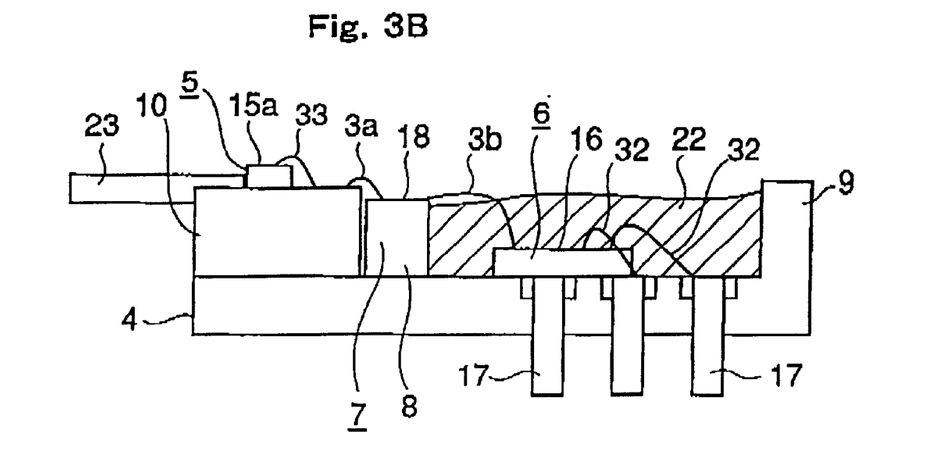

FIGS. 3A and 3B show a third embodiment of the optical module according to the invention. FIG. 3A is a perspective view of the optical module in which the package member disposed on the base 4 is omitted, FIG. 3B shows a cross-section of the optical module with sealing resin 22. The sealing resin 22 is for preventing dust from attaching to the IC 6 and for preventing a person handling the module from touching the IC 6 directly on his or her hand. It is preferable, but not necessarily limited to, to use the sealing resin 22 made of material having the same coefficient of thermal expansion as the base 4.

The third embodiment has almost same structure as the above second embodiment except for the following difference; a second wall portion 9 adjacent to the first wall portion 8 of the relay terminal table 7 is provided as a surrounding wall portion so that the periphery of the electronic device mounting area 21 would be surrounded by the above second wall portion 9 and the first wall portion 8. The above first wall portion 8 and the second wall portion 9 function as a wall for preventing sealing resin 22, with which the electronic device mounting area 21 is filled, from flowing out. In the third embodiment, the flow-preventing wall is formed into one body with the base 4 by pre-molding.

The third embodiment has a similar effect to the above second embodiment.

Especially in the third embodiment, the flow-preventing wall of the sealing resin 22 is formed by the first wall portion 8 forming the relay terminal table 7 and the second wall portion 9 communicating with the first wall portion 8, so that the flow-preventing wall can be used for extremely easily and accurately sealing with resin the electronic device mounting area 21 only. Mounting the optical device 5 after the resin-sealing can protect the IC 6 by means of resin and surely prevent the IC 6 from being damaged during the process.

A structure according to the above related art is such that both of the IC 6 and the optical device 5 are sealed with resin. In the third embodiment, however, the mounting area of the IC 6 (electronic device mounting area) 21 is only sealed with resin. Accordingly, the optical device 5 can be repaired even after the resin-sealing, which means effective use of components can be achieved, so that the time for a repairing operation can be shortened.

Moreover, the above flow-preventing wall is formed into one body with the base 4 by pre-molding in the third embodiment. Thus, comparing to the case that the flow-preventing wall is fixed to the base 4 by such as adhesion after molding the base 4, for example, the flow-preventing wall can be formed more efficiently. When the flow-preventing wall is formed by adhesion, the case may occur that a function of preventing resin from flowing out cannot be exerted due to such as a mistake in adhesion. In the third embodiment, however, there is no such problem and the resin can be surely prevented from flowing out, while the electronic device mounting area 21 only can be accurately sealed with resin. The flow-preventing wall can be also formed by adhesion, of course, since the flow of resin can be accurately prevented, provided that the adhesion would be achieved with no mistake.

FIGS. 6A to 6E show a fourth embodiment of the optical module according to the invention with its assembling process. The optical device in the fourth embodiment is different from that of the above third embodiment in that the optical device 5 is provided together with the optical bench 10 on the bottom side of the ferrule package 26. Other structure of the fourth embodiment is same as that of the above third embodiment.

Figure 6A:
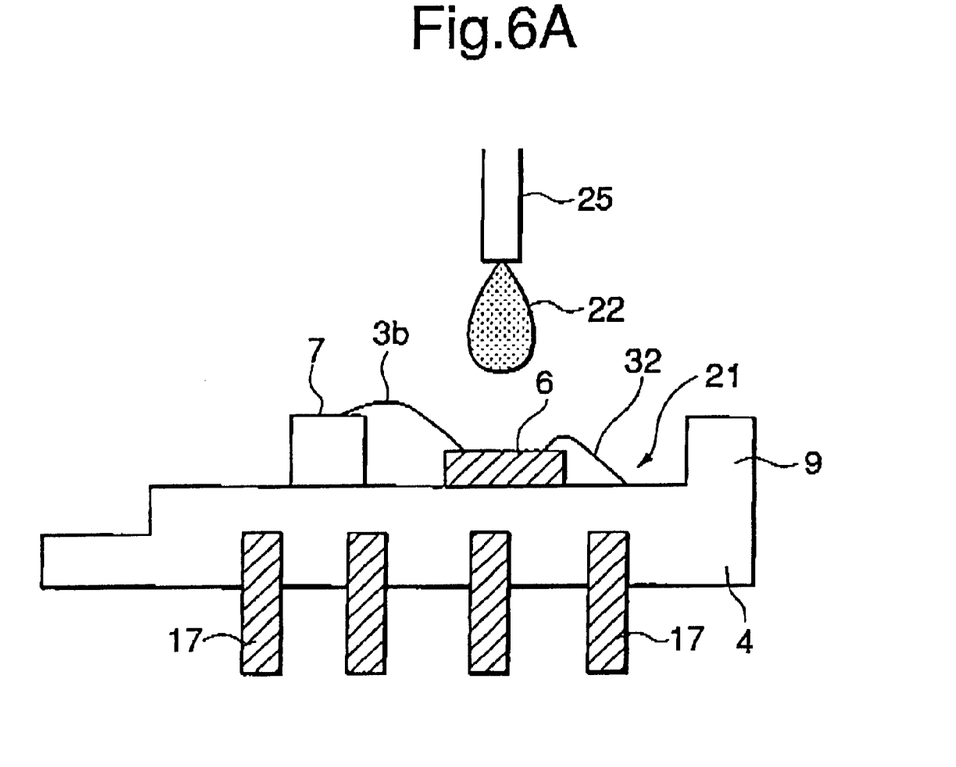
FIGS. 6A to 6E are illustration showing a fourth embodiment of the optical module according to the invention.
Figure 6B:
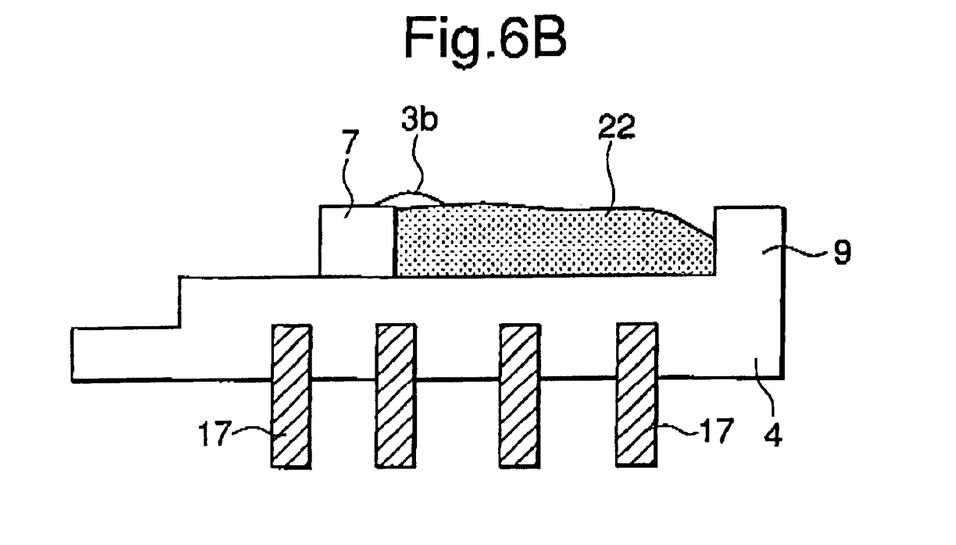

FIG. 6A shows a process that the IC 6 is mounted in the electronic device mounting area 21 on the base 4 to carry out wire bonding 3b and 32, as shown in FIG. 3A, before filling the electronic device mounting area 21 surrounded by the relay terminal table 7 (a first wall portion 8) and the second wall portion 9 with the first sealing resin 22 by means of a nozzle 25. FIG. 6B shows the condition that the first sealing resin 22 hardened after the filling-in.

Figure 6C:
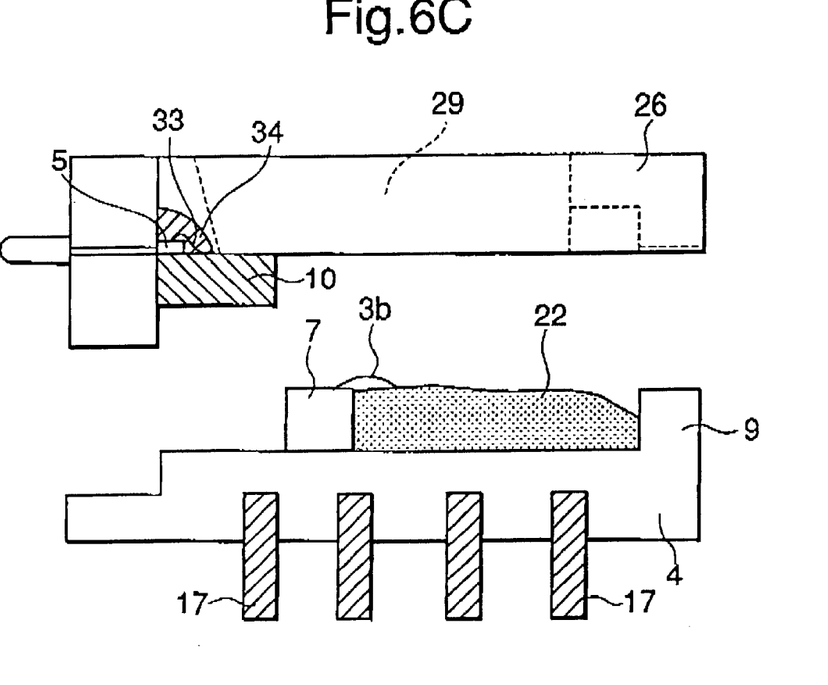

Then, the sealing resin 22 hardens after the filling-in, and the ferrule package 26 is disposed above the base 4 as shown in FIG. 6C. In the fourth embodiment, the optical bench 10 on which the optical device 5 is mounted is fixed on the bottom side of the ferrule package 26 in advance. The optical device 5 can be mounted on a base 4 through the optical bench 10 by disposing the ferrule package 26 on the base 4.

An optical fiber 23 is inserted into and fixed to the ferrule package 26 so as to optically couple the optical device 5. Transparent fixing resin made of silicone resin, for example, is formed at lease between the optical fiber 23 and the optical device 5.

Figure 6D:
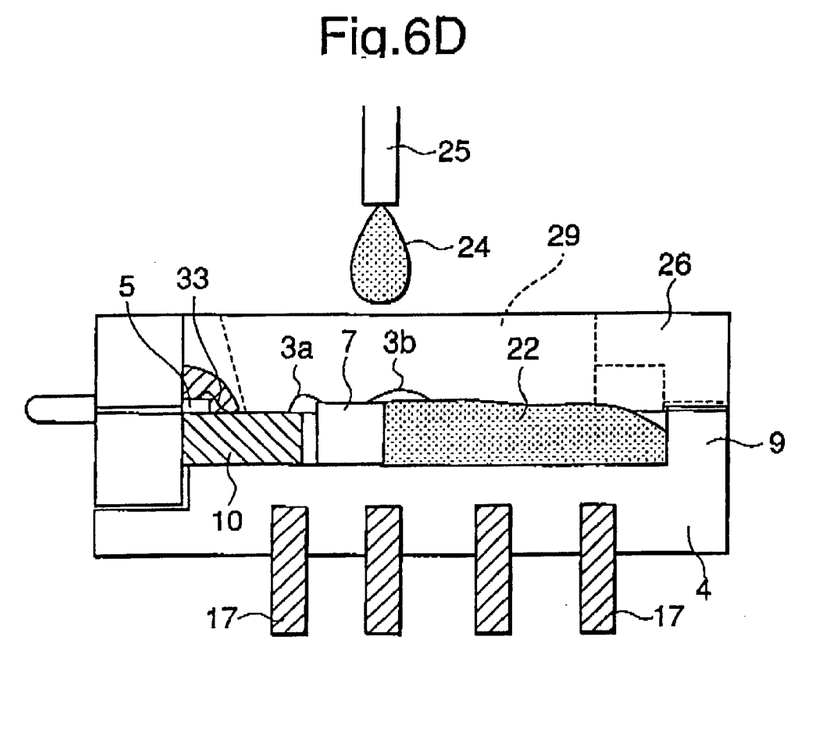
Figure 6E:
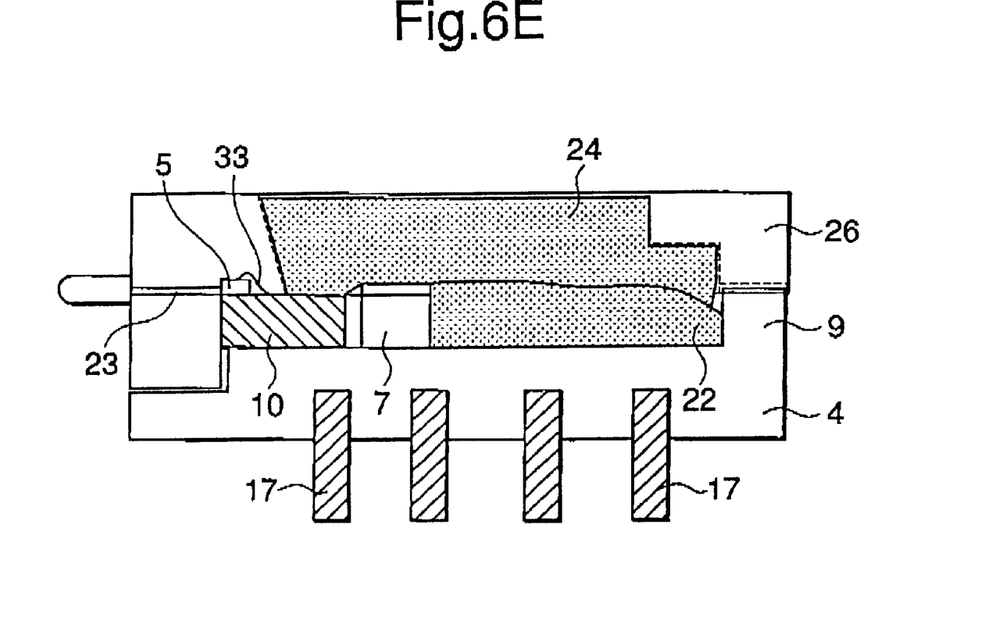

An opening portion 29 provided in the ferrule package 26 is used for bonding the wire 3a on a side of the optical bench 10 and on a side of the relay terminal table 7. After completing the bonding of the wire 3a, the nozzle 25 is used for filling the opening portion 29 of the ferrule package 26 with second sealing resin 24 made of, for example, epoxy resin, as shown in FIGS. 6D and 6E. The upper side of the electronic device mounting area 21 and the relay terminal table 7 are embedded in the second sealing resin 24 after the filling with the second sealing resin 24, so that the base 4 and the ferrule package 26 are fixed together as one body.

It is possible not to seal the relay terminal table 7 with the sealing resin 24 and to expose the relay terminal table 7 as shown in FIG. 3B, although the relay terminal table 7 is sealed with the second sealing resin 24 in FIG. 6E.

The electronic device mounting area 21 is sealed with the first sealing resin 22 and the second sealing resin 24, which are made of different sealing material, in the fourth embodiment. The following combination of the sealing resin has the following effect.

Resin, which has a characteristic of the coefficient of thermal expansion close to the electronic device 6 and the lead terminal 17, is used as the first sealing resin 22, so that the electronic device and the lead terminal can be prevented from being broken. Resin, which has a characteristic of transparency and lower stress to optical device 5, is used as fixing resin 34. Resin, which has a characteristic of the coefficient of thermal expansion close to the lead terminal, is used as the second sealing resin 24.

It is possible to omit the fixing resin 34 so that the second sealing resin 24 would enter between the optical fiber 23 and the optical device 25. In this case, it is required that the second sealing resin 24 has a characteristic similar to the fixing resin 34.

Such combination of resin can reduce stress for both of the optical device and the electronic device, and it becomes possible to provide an optical module, which is superior in the optical characteristic.

Figure 7:
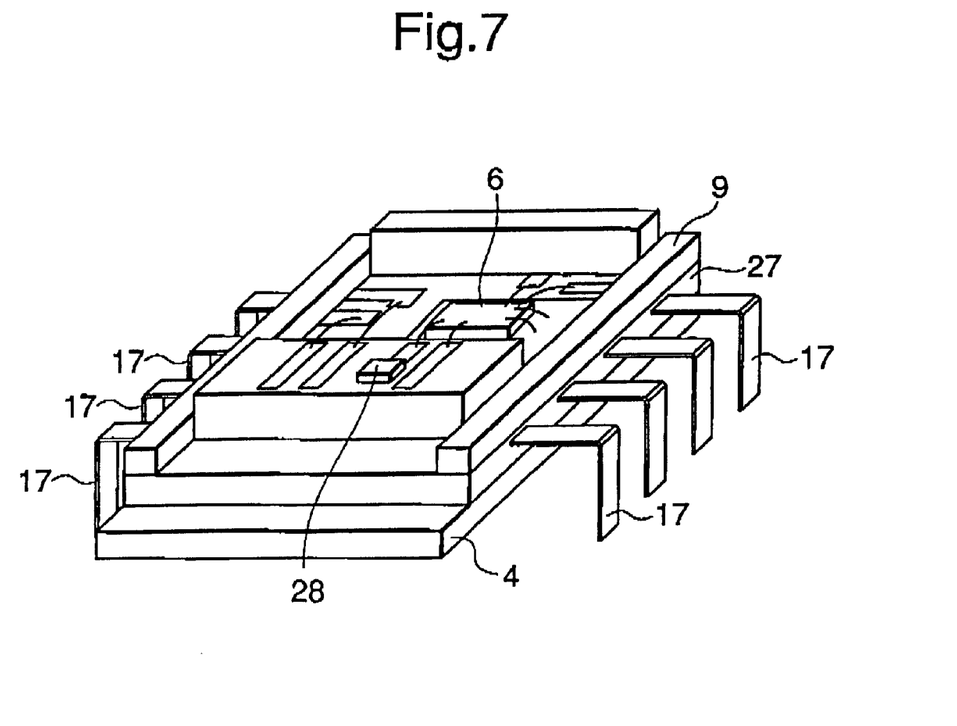
FIG. 7 is illustration showing a fifth embodiment of the optical module according to the invention.

FIG. 7 shows a fifth embodiment of the optical module according to the invention. In this fifth embodiment, the upper surface of the relay terminal table 7 is used as a wiring surface of electronic components of a module circuit. It is possible to make the structure other than the above same as that of the above each embodiment. In an example shown in FIG. 7, the lead package 27 is disposed on a periphery of the upper surface of the base 4 and the second wall portion 9 is formed above a frame surface of the lead package 27. The base 4, the lead package 27 and the second wall portion 9 are formed into one body by filling an electronic device mounting area 21 with the sealing resin 22.

In the example shown in FIG. 7, a chip condenser 28 for adjusting capacitance of the module is mounted on the above relay terminal table 7 and the size of the relay terminal table 7 is adjusted so as to be adequate for wire-bonding the condenser 28. Another proper electronic circuit device such as resistance device may be mounted as an electronic component mounted on the relay terminal table 7. It is possible to improve degree of freedom in electric design of the module by mounting the electronic components on the relay terminal table 7 as described above.

The present invention is not limited to the above each embodiment and can adopt various manners of practice. For example, a concrete structure of the optical device and the electronic device has no specific limitation, and any device can be selected for use in accordance with a design and a specification.

For example, it would be also possible to easily achieve electric conductance between the relay terminal table 7 and the lead terminal, when a through hole is formed in the relay terminal table so that the metal pattern formed on the upper and lower surface of the relay terminal table would become conductive by means of the through hole.

What is claimed is:

1. An optical module comprising:
   a base;
   an optical device, an electronic device and a relay terminal table mounted on the above base;
   first electric wiring for electrically connecting the optical device with the relay terminal, said first electric wiring being removable when replacing the optical device;
   second electric wiring for electrically connecting the electronic device with the relay table;
   wherein the above optical device and the above electronic device are electrically connected via the above relay terminal table by means of the above first and second electric wiring.

2. The optical module according to claim 1 further comprising an optical device mounting area and an electronic device mounting area, which are separately arranged through the relay terminal table.

3. The optical module according to claim 2 further comprising a package for covering the above optical device mounting area and the electronic device mounting area together with the base.

4. The optical module according to claim 3 further comprising an optical fiber fixed in the package so as to optically couple the optical device.

5. The optical module according to claim 3 further comprising:
- an opening portion provided in the package; and
- resin, with which the above opening portion is filled, for protecting the optical device.

6. The optical module according to claim 1 further comprising an optical bench on which the above optical device is mounted.

7. The optical module according to claim 1 further comprising:
- a wall for surrounding a periphery of the electronic device mounting area; and
- resin for sealing the electronic device mounting area surrounded by the wall.

8. The optical module according to claim 7, wherein a flow-preventing wall is formed into one body with the base by pre-molding.

9. The optical module according to claim 1 further comprising an electronic component provided on the relay terminal table.

10. The optical module according to claim 1 further comprising a lead terminal fixed to the base.

11. A method for repairing an optical device of the optical module according to claim 1, comprising the following steps:
- a step of removing first electric wiring from an optical device side;
- a step of changing the optical device; and
- a step of reattaching the first electric wiring to the optical device side.

12. A method for manufacturing an optical module, comprising the following steps:
- a step of mounting an optical device on a base;
- a step of mounting an electronic device on the base;
- a step of mounting a relay terminal table on the base;
- a step of removably connecting first electric wiring to the optical device and the relay terminal table when replacing the optical device; and
- a step of connecting second electric wiring to the electronic device and the relay terminal table.

13. The method for manufacturing an optical module according to claim 12, further comprising the following step;
- a step of protecting the electronic device by means of resin.

14. The method for manufacturing an optical module according to claim 12, further comprising the following step;
- a step of protecting the optical device by means of resin.

15. A method for manufacturing an optical module, comprising the following steps:
- a step of mounting an electronic device on a base;
- a step of mounting a relay terminal table on the base;
- a step of connecting second electric wiring to the electronic device and the relay terminal table; and
- a step of mounting an optical device on the base, and then, further comprising the following step;
- a step of removably connecting first electric wiring to the optical device and the relay terminal table when replacing the optical device.

* * * * *